United States Patent
Oliphant et al.

(10) Patent No.: US 6,461,170 B1
(45) Date of Patent: Oct. 8, 2002

(54) STACKED ELECTRONIC INTEGRATED CARD ASSEMBLY WITH MULTI-FUNCTION SHARED INTERFACE

(75) Inventors: David Oliphant, West Jordan, UT (US); Steven LoForte, Copperton, UT (US); Brent Nixon, Salt Lake City, UT (US); Brent Madsen, Providence, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/859,903

(22) Filed: May 17, 2001

(51) Int. Cl.$^7$ .............................................. H01R 12/00

(52) U.S. Cl. ..................................... 439/76.1; 361/737

(58) Field of Search .............................. 439/76.1, 638, 439/945, 946; 361/686, 737

(56) References Cited

U.S. PATENT DOCUMENTS

| | | | |
|---|---|---|---|
| 4,821,146 | * 4/1989 | Behrens et al. ............. 361/383 |
| 5,183,404 | 2/1993 | Aldous et al. ................ 439/55 |
| 5,184,282 | 2/1993 | Kaneda et al. .............. 361/395 |
| 5,331,516 | * 7/1994 | Shinohara et al. .......... 439/946 |
| 5,336,099 | 8/1994 | Aldous et al. .............. 439/131 |
| 5,338,210 | 8/1994 | Beckham et al. ........... 439/131 |
| 5,391,094 | 2/1995 | Kakinoki et al. ........... 439/638 |
| 5,411,405 | 5/1995 | McDaniels et al. ......... 439/131 |
| 5,457,601 | 10/1995 | Georgopulos et al. ...... 361/686 |
| 5,513,074 | 4/1996 | Ainsbury et al. ........... 361/737 |
| 5,528,459 | 6/1996 | Ainsbury et al. ........... 361/737 |
| 5,547,401 | 8/1996 | Aldous et al. .............. 439/676 |
| 5,562,504 | 10/1996 | Moshayedi .................. 439/638 |
| 5,605,463 | 2/1997 | MacGregor ................... 439/64 |
| 5,608,606 | 3/1997 | Blaney ........................ 361/686 |
| 5,608,607 | * 3/1997 | Dittmer ....................... 361/686 |
| 5,613,860 | 3/1997 | Banakis et al. ............... 439/64 |
| 5,619,396 | 4/1997 | Gee et al. .................... 361/386 |
| 5,628,637 | 5/1997 | Pecone et al. ................. 439/74 |
| 5,637,001 | 6/1997 | Nony et al. .................. 439/131 |
| 5,643,001 | 7/1997 | Kaufman et al. ........... 439/159 |
| 5,655,918 | 8/1997 | Soh ............................. 439/159 |
| 5,660,568 | 8/1997 | Moshayedi .................. 439/654 |
| 5,716,221 | 2/1998 | Kantner ........................ 439/64 |
| 5,727,972 | 3/1998 | Aldous et al. .............. 439/655 |
| 5,773,332 | 6/1998 | Glad ........................... 439/344 |
| 5,775,923 | 7/1998 | Tomioka ....................... 439/79 |
| 5,797,771 | 8/1998 | Garside ....................... 439/610 |
| 5,816,827 | 10/1998 | Nelson et al. ................ 439/64 |
| 5,816,832 | 10/1998 | Aldous ........................ 439/131 |

(List continued on next page.)

FOREIGN PATENT DOCUMENTS

WO    WO 95/13633    5/1995

OTHER PUBLICATIONS

PCI (Peripheral Component Interconnect), "PCI Overview Class or CD," www.winteltraining.com/comppci.htm, p. 1 (1998).

Primary Examiner—Khiem Nguyen
(74) Attorney, Agent, or Firm—Workman, Nydegger & Seeley

(57) ABSTRACT

A computer card assembly for removeable insertion into a receiving/expansion slot of a host computer is presented. The computer card assembly facilitates the removal and recombination of at least one electronic card in an electronic card interface tray that includes a shared interface. An electronic card interface tray includes an external shared interface that can facilitate larger jacks and opposing sidewalls which together form bays or slots within the computer card assembly. The electronic card is sized to be received within a bay of the card tray to facilitate insertion of the computer card assembly into the host expansion slot. The electronic card supports the standard host interface while sharing and external interface, such as a network interface, with other cards within the computer card assembly.

27 Claims, 9 Drawing Sheets

U.S. PATENT DOCUMENTS

| | | | |
|---|---|---|---|
| 5,847,932 | 12/1998 | Kantner | 361/737 |
| 5,876,218 | 3/1999 | Liebenow et al. | 439/74 |
| 5,988,511 | 11/1999 | Schmidt et al. | 435/492 |
| 6,097,605 * | 8/2000 | Klatt et al. | 361/737 |
| 6,173,405 | 1/2001 | Nagel | 713/200 |
| 6,174,205 | 1/2001 | Madsen et al. | 439/638 |
| 6,217,351 | 4/2001 | Fung et al. | 439/131 |
| 6,272,017 * | 8/2001 | Klatt et al. | 361/737 |

\* cited by examiner

STACKED ELECTRONIC INTEGRATED CARD ASSEMBLY WITH MULTI-FUNCTION SHARED INTERFACE

BACKGROUND OF THE INVENTION

1. Field of the Invention

The present invention generally relates to electrical connectors and, in particular, to connectors for electrically coupling communication equipment to electrical devices.

2. The Prior State of Related Art

Electrical devices, such as personal computers, laptop computers, portable computers, notebook computers, palmtop computers, cellular telephones, personal information managers (PIM) and personal data assistants (PDA), are becoming increasingly dependant upon their ability to electrically communicate or share information with other electrical devices. To facilitate this electrical communication, a variety of different types of electrical couplers have been developed. In general, these electrical couplers include a plug and a corresponding jack. The jack typically includes an aperture or socket and when the plug is inserted into the jack, an electrical connection is established.

These known electrical couplers are frequently designed for use with devices such as cards that are made in accordance with standards established by the Personal Computer Memory Card International Association (PCMCIA). These cards, often referred to as PC Cards, can be designed to perform a variety of different functions and a circuit board located within the card provides the necessary circuitry to perform the intended function. For example, a PC card may allow a device to receive and transmit information over telephone lines, or alternatively, the PC card may allow the device to receive and transmit information over a network system such as a Local Area Network (LAN) or a myriad of other wired and wireless network architectures.

PC Cards have become increasingly popular in portable computers because the cards are readily interchangeable and assume a small compatible form factor. Additionally, PC cards are very popular because they allow a user to relatively quickly and easily link a computer to a modem and obtain information and data from a remote computer. Thus, users can transmit and receive data from various locations, such as at home, during business meetings, on vacation, while traveling, or from other remote locations.

In general, PC Cards have a thin, elongated structure which is inserted into an opening or slot in the body of a computer. The PC Cards have a connector at one end which is configured to be coupled to the computer and the other end of the card may have a connector configured to be coupled to communication equipment such as a telephone line. Typically, a standard RJ-11 telephone jack is used to connect a telephone line to the PC card. These PC Cards are typically designed to be readily connected or removed from the electrical device.

As electronics become more and more integrated, the dimensions of the PC Cards may be reduced and allow for the combination of multiple PC Cards within a computing device. In FIG. 1, such an arrangement of stacked multiple PC Cards is depicted which can be received into a multiple bay slot within the body of a computer. PCMCIA standards have been defined for various PC card dimensions. The standard establishes a dimension which receives a 68-pin connector for coupling with the host computer. Each individual package maintains the same slot width and depth, but the thickness of each of the card dimensions differs. For example, there are three relatively common standards or types defined within PCMCIA standard. These standards include a Type I, Type II, and Type m with corresponding card thickness of 3.3 mm, 5.0 mm, and 10.5 mm, respectively.

When multiple cards are stacked, such as cards 10 and 12 of FIG. 1, their individual thickness is inadequate for the placement of a modular receiving socket or jack on the exposed face of the card when inserted into the host computer. As such, reduced size connectors are employed which require the coupling of an external separate structure, not shown, commonly known to those of skill in the art as a "dongle" which facilitates the physical expansion of a connector dimension from the low-profile connector 14 on the face of the PC card with a network interface cable having, for example, an RJ-11 or RJ-45 plug. Such a dongle is required in the configuration of FIG. 1 for connecting the PC card 10 to, for example, a telephone line, however, if the dongle is lost, misplaced or damaged, the connection to the telephone line cannot be established. Such a requirement of an additional device such as a dongle results in a further undesirable requirement placed upon the user for coupling the host computer via a PC card to a network.

To facilitate the greater height dimension of the connecting plug into PC Cards resident within a host computer, electronic cards such as that depicted in FIG. 2 have proliferated. Electronic cards such as card 20 combine integrated functionality within the higher profile card thereby facilitating the integration of sockets or jacks depicted generally as 22 and 24. Such combination or integrated cards typically result in a Type III form factor thereby occupying the plurality of available slots within the computer host. While integration is generally thought of as being an advantage by having multiple functionality resident within a single structure, such an integration presents a disadvantage in the form of the loss of flexibility and functionality selectability by the user in configuring and assigning the desired functionality to the limited slots within the host computer. One such attempt at increasing the flexibility of an increased width PC card is disclosed in U.S. Pat. No. 5,608,607 issued to Dittmer. The Dittmer patent discloses a PCMCIA card structure, as generally depicted in FIG. 3, which includes a "circuitry augmenting and support structure" 32 which may include electronic circuitry therein. The circuitry augmenting a support structure 32 receives a PCMCIA card 34 of a thinner configuration which is supported by projecting rail portions 36 and corresponding projecting rail portions 38. As depicted in Dittmer, the computer card structure upon receiving PC card 34 into the circuitry augmenting and support structure 32 significantly extends from the host computer resulting in a cumbersome and undesirable protrudance from the host computer form factor.

Thus, because of the cumbersome and undesirable nature of such interface protrudances, it would be desirable to have an improved PC card structure assembly that facilitates flexibility both in configuration of desirable functionality within the available host computer slot and the flexibility for facilitating upgrading or altering of components within the PC card structure.

SUMMARY OF THE INVENTION

The present invention has been developed in response to the current state of the art, and in particular, in response to these and other problems and needs that have not been fully or completely solved by currently available interconnects. In one embodiment, the present invention provides a computer card assembly capable of removeable insertion with a host computer that has a receiving slot therein. The computer card assembly may also conform to standards that are recognized in the industry such as the PCMCLA expansion card standard. The computer card assembly provides an environment for the interchange of electronic cards into an electronic card interface tray that, when populated with one or more electronic cards, conforms to the expansion card specification and may be inserted into the expansion slot of the host computer.

The computer card assembly include two or more components, first an electronic card interface tray that includes a shared interface and one or more electronic cards. The electronic card interface tray includes an external shared interface for interconnecting between each of the electronic cards and the external network of service. The electronic card tray, in the preferred embodiment, assumes a generally "I" shaped cross-section which includes opposing sidewalls which are physically spaced and structurally suspended by a sidewall separator spanning between the opposing sidewalls. The sidewall separator in conjunction with the opposing sidewalls form, in the preferred embodiment, an upper internal electronic card bay above the sidewall separator and a lower internal electronic card bay below the sidewall separator.

The computer card assembly further includes one or more electronic cards that are inserted into the corresponding card bay(s) formed within the electronic card tray. The electronic cards are sized smaller than the exterior dimensions of the electronic card tray such that they may be received within the electronic card tray and enable the entire assembly to be received within the receiving slot of the host system. The electronic card(s) share the common interface of the shared interface of the electronic card interface tray. Electronic cards may be from a myriad of functional types such as modem, network, communication, etc.

Another related configuration supports the ability to partially populate the electronic card tray with a number of electronic cards that is fewer than the available card bays. Yet other configurations allows for the population of the card tray with non-I/O type cards such as memory expansion cards or coprocessor cards.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other aspects, features and advantages of the invention are obtained, a more particular description of the invention briefly described above will be rendered with reference to specific embodiments thereof which is illustrated in the appended drawings. Understanding that these drawings depict only a typical embodiment of the invention and are not therefore to be considered limiting of its scope, the invention will be described and then explained with additional specificity and detail through the use of the accompanying drawings in which.

DETAILED DESCRIPTION OF THE PREFERRED EMBODIMENTS

The present invention involves a multi-slot card assembly which provides a functional or communication bridge between a host computer and an external structure such as a network or other interfaceable electronic architecture. While the present exemplary embodiment is illustrated for integration within a PCMCIA standard, it is recognized that the present invention finds application and utility in other standards that facilitate expansion card architectures. Furthermore, the present invention not only finds application in computers that employ expansion card architectures, the present invention also finds application in other electronic devices such as personal digital assistants, cellular telephones, as well as all other types of electronic devices having expansion or upgradable architectures.

Additionally, to assist in the description of the multi-slot card assembly, words such as top, bottom, front, rear, right and left may be used to describe the accompanying figures. It will be appreciated, however, that the present invention may be located in a variety of desired positions, including various angles, orientations with relocations of specific components.

Further, it will be understood that in the following description, numerous details are set forth such as specific types of communication connectors or plugs, communication standards, etc., to provide a thorough understanding of the present invention. One skilled in the art will recognize, however, that the multi-slot card assembly may be used in conjunction with various communications systems, electrical devices and a wide variety of suitable connectors, plugs, contacts, and other structures or devices.

Figure 1:
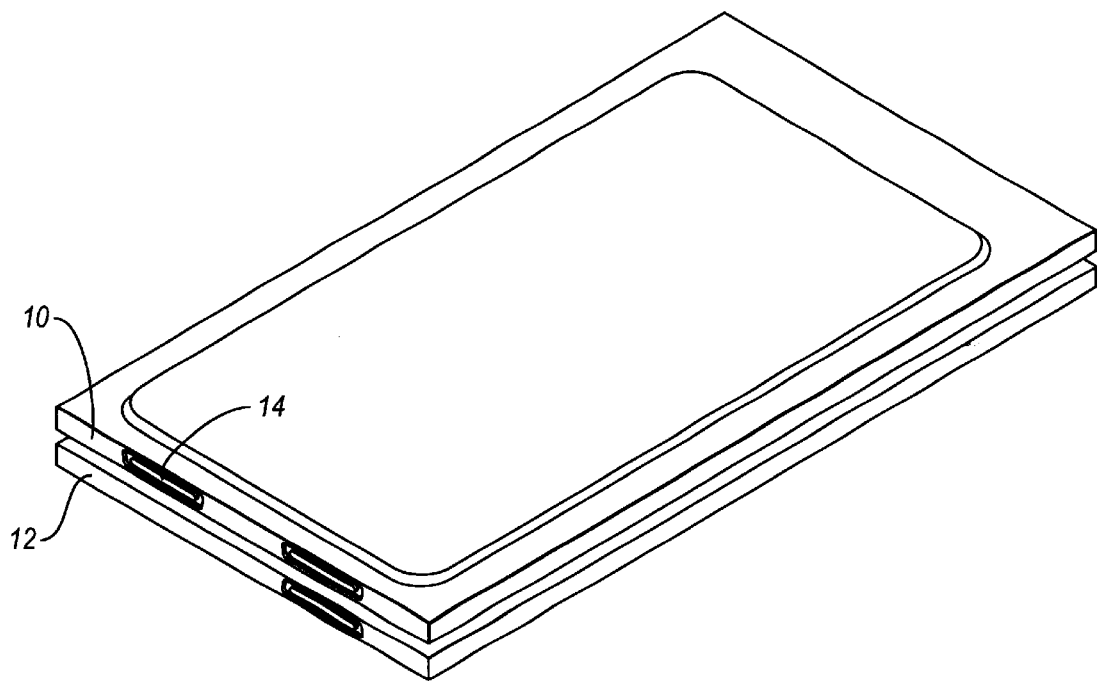
FIG. 1 depicts a plurality of PC Cards in accordance with the prior art.
Figure 2:
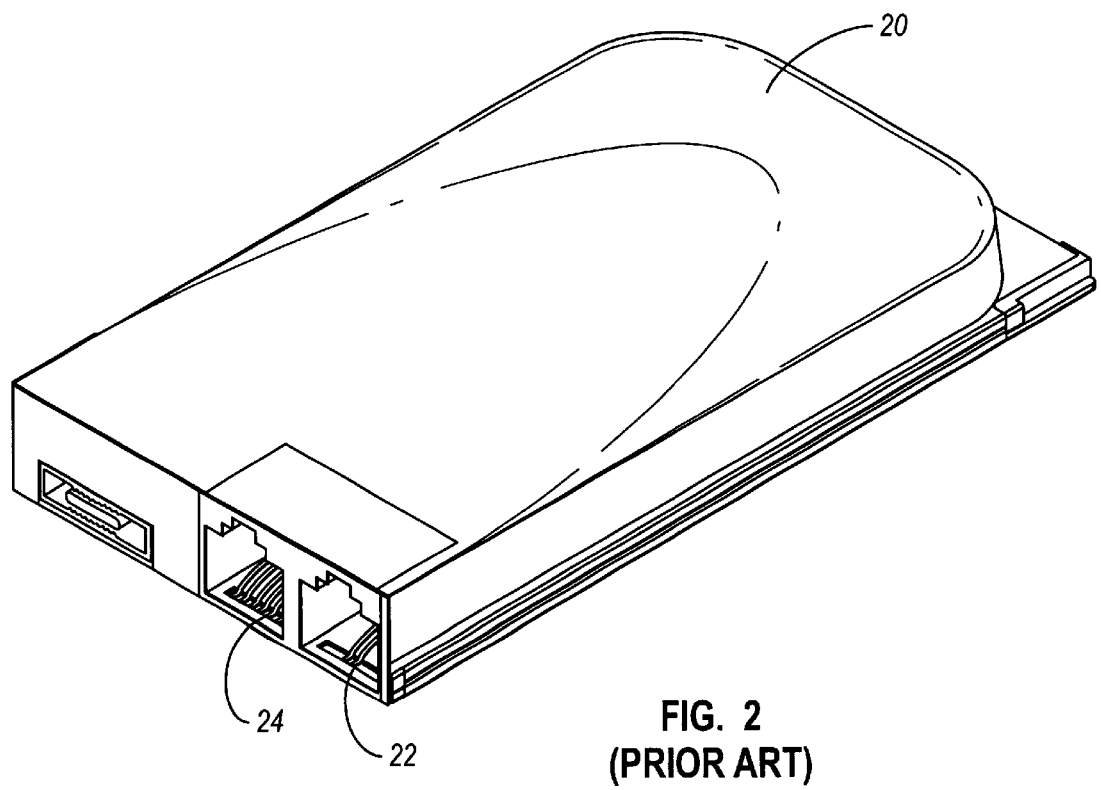
FIG. 2 depicts an integrated combination card, in accordance with the prior art.
Figure 3:
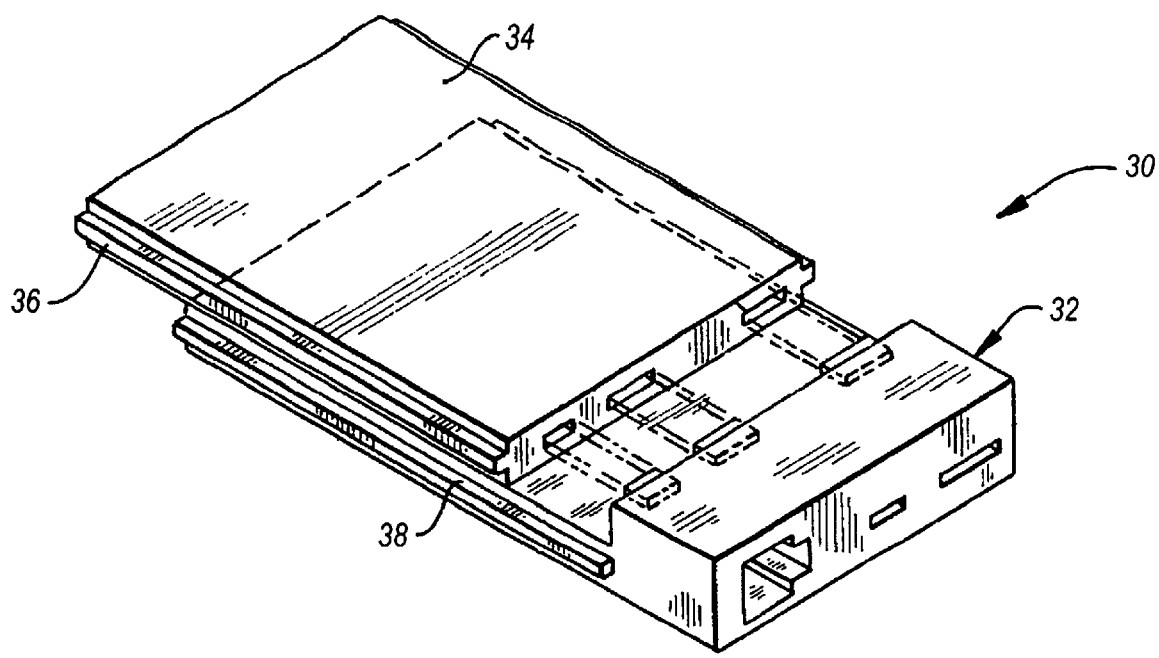
FIG. 3 depicts a PC card with a protruding support and circuitry apparatus, in accordance with the prior art.
Figure 4:
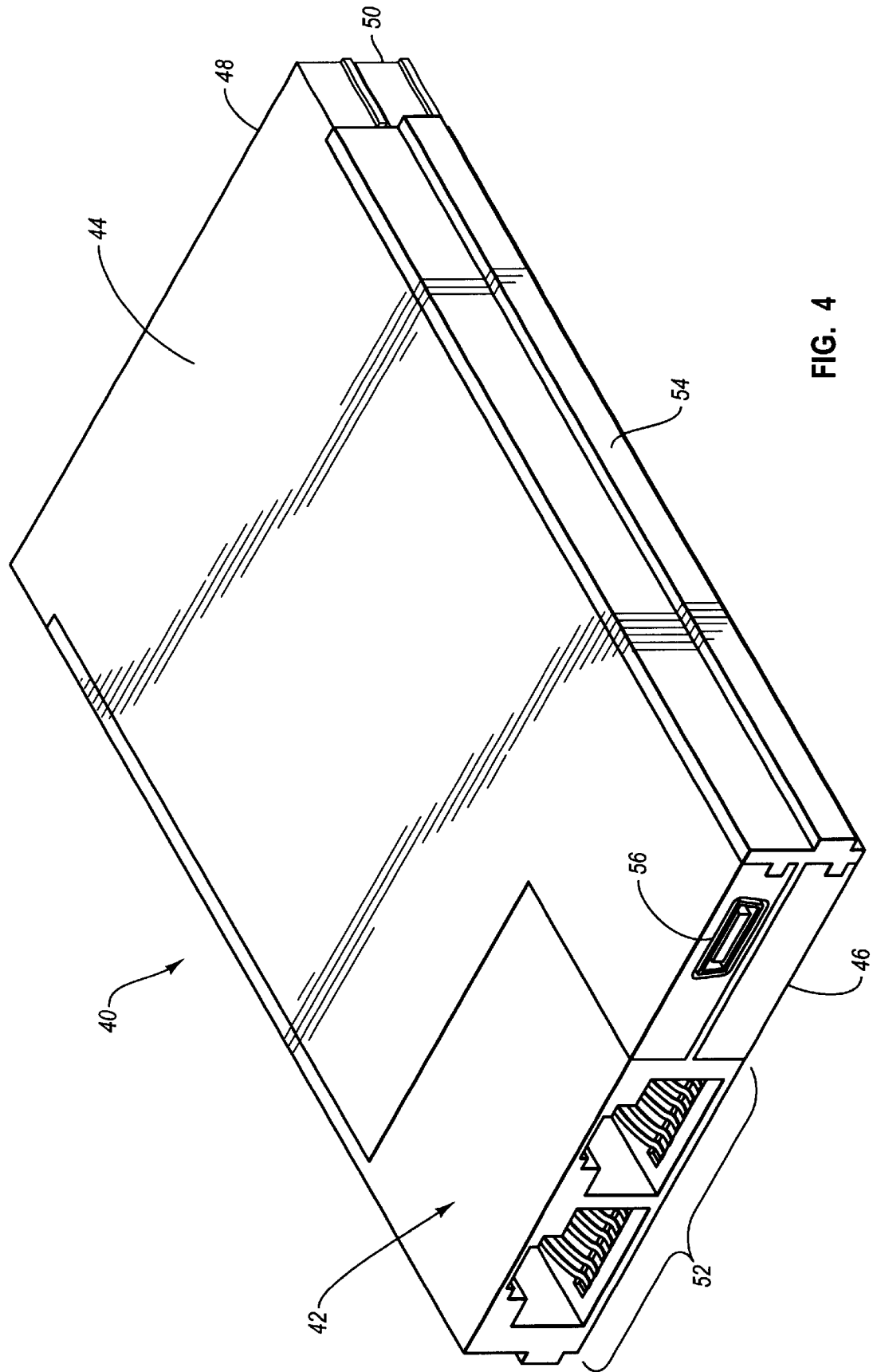
FIG. 4 is a perspective view of a multi-slot card assembly, in accordance with a preferred embodiment of the present invention.

FIG. 4 illustrates a perspective view of a multi-slot card assembly 40 which is configured to be received within an expansion slot or bay of a computing host such as a personal computer having expansion slots for receiving assemblies therein. The multi-slot card assembly 40 is sized and configured to conform with one exemplary standard known as the Personal Computer Memory Card International Association (PCMCIA) standard. The PCMCIA standard, for example, is described in detail in the PCMCIA Specification Standard Release 2.1, which is hereby incorporated by reference. The PCMCIA specification, for example, provides standards for data storage and peripheral expansion cards. Additionally, the PCMCIA specifications provide standards for input/output (I/O) capability for a standard bus extension slot so that peripherals such as modems and LAN adaptors can use the bus. It will be understood, however, that while the multi-slot card assembly 40 is described with respect to PCMCIA standards, the multi-slot card assembly may be used with other types of expansion or peripheral card standards.

The multi-slot card assembly 40 is a generally elongated and generally planar assembly, and under the exemplary standard, conforms to a PCMCIA Type III configuration having the general dimensions of approximately 85.6 mm in length by 54.0 mm in width with an approximate height of 10.5 mm.

The multi-slot card assembly 40 is comprised of three general components, a multi-card interface tray 42, a first card 44 and a second card 46. The first card 44 and the second card 46 each individually contain electronic circuitry for accomplishing one or more of a myriad of electronic functions such as LAN functionality, Wide Area Network (WAN) network functionality, ISDN functionality, as well as other computational or communication-related functionality. It is also contemplated that one of cards 44 and 46 may perform the aforementioned communication functionality while another one of cards 44 and 46 may perform non-interfacing functionality such as memory expansion or coprocessing.

The multi-card interface tray 42 forms a shared interface between both first card 44 and second card 46. In the present embodiment, multi-card interface tray 42 is illustrated to have a shared interface 52 comprised of interconnection sockets or jacks exhibiting a height profile greater than the profile available in a single card 44 or 46. By way of example, shared interface 52 is depicted as having jacks for compatibly receiving RJ-xx plugs, including RJ-11 and RJ-45 plugs. The embodiment illustrated in FIG. 4 further depicts the shared interface 52 as occupying only a portion of the front of multi-card assembly 40. Such a partial occupation of the frontal portion of the multi-slot card assembly 40 facilitates the presentation of specific non-shared or dedicated interfaces such as a dedicated interface 56 extending from first card 44. While a partial occupation of the frontal portion of multi-card interface tray 42 is depicted, it is also contemplated that shared interface 52 could comprise the entire front portion of multi-slot card assembly 40.

A multi-card interface tray 42 further includes a standard interface guide rail 54 which is compatible with and conforms to a multi-slot card assembly 40 conforming standard, such as a PCMCIA Type III standard. The multi-card interface tray 42 further provides the appropriate spacing and orientation requirements to facilitate the operable and compliant interconnection of a first card host interface 48, resident on first card 44, and a second card host interface 50, resident on the second card 46, with the hosting device or computer. By way of example, first card host interface 48 and second card host interface 50, when conforming with a PCMCIA standard, are comprised of a 68-pin array of interconnection pins.

Figure 5:
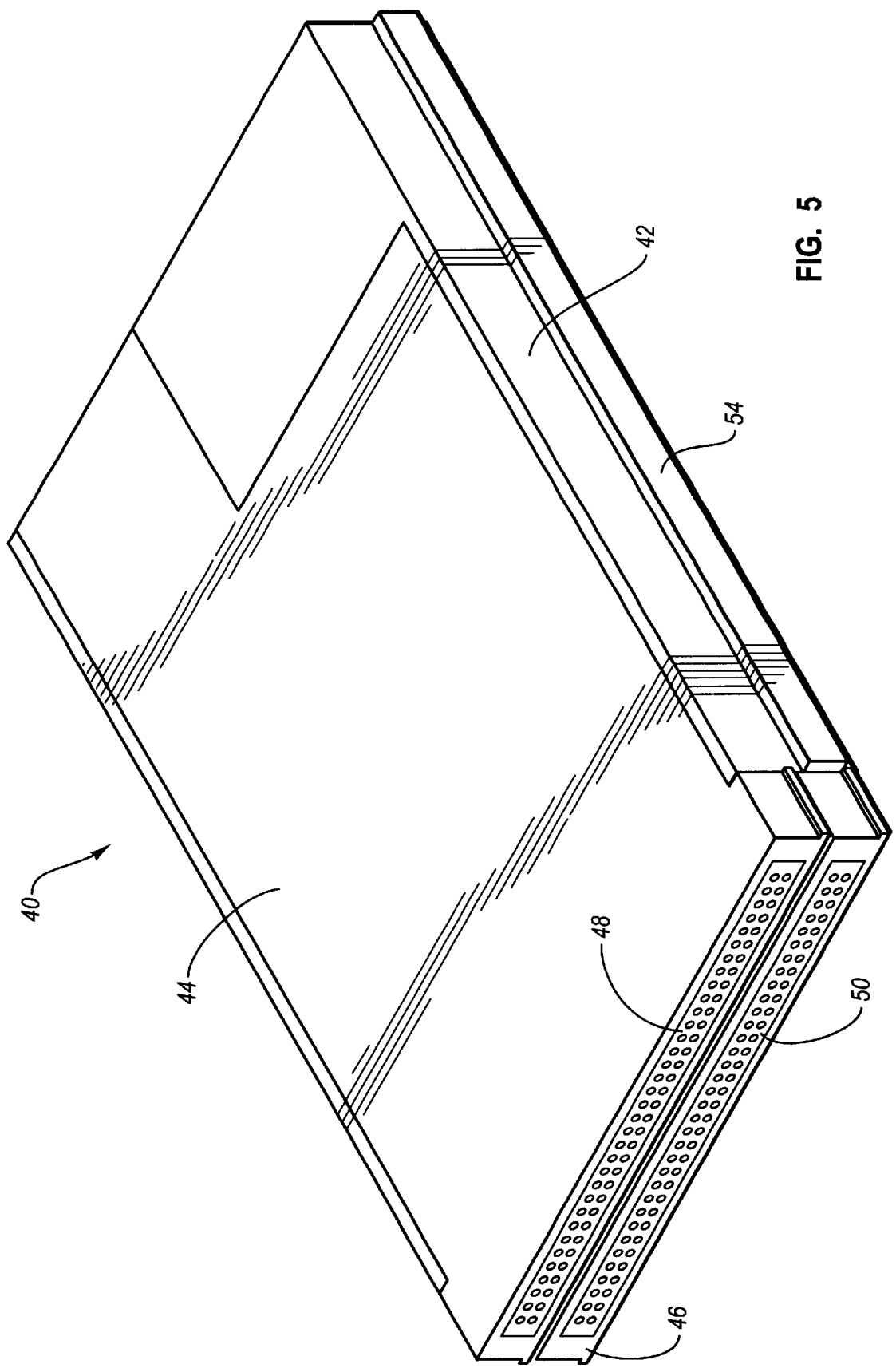
FIG. 5 is an opposing perspective view of a multi-slot card assembly, in accordance with a preferred embodiment of the present invention.

FIG. 5 is a perspective rear view of the multi-slot card assembly 40, in accordance with a preferred embodiment of the present invention. FIG. 5 provides an additional view of the components of the multi-slot card assembly 40, namely the first card 44, the second card 46 and the multi-card interface tray 42. FIG. 5 illustrates the preferred orientation provided by multi-card interface tray 42 of the respective cards 44 and 46 and their respective card host interfaces 48 and 50.

Figure 6:
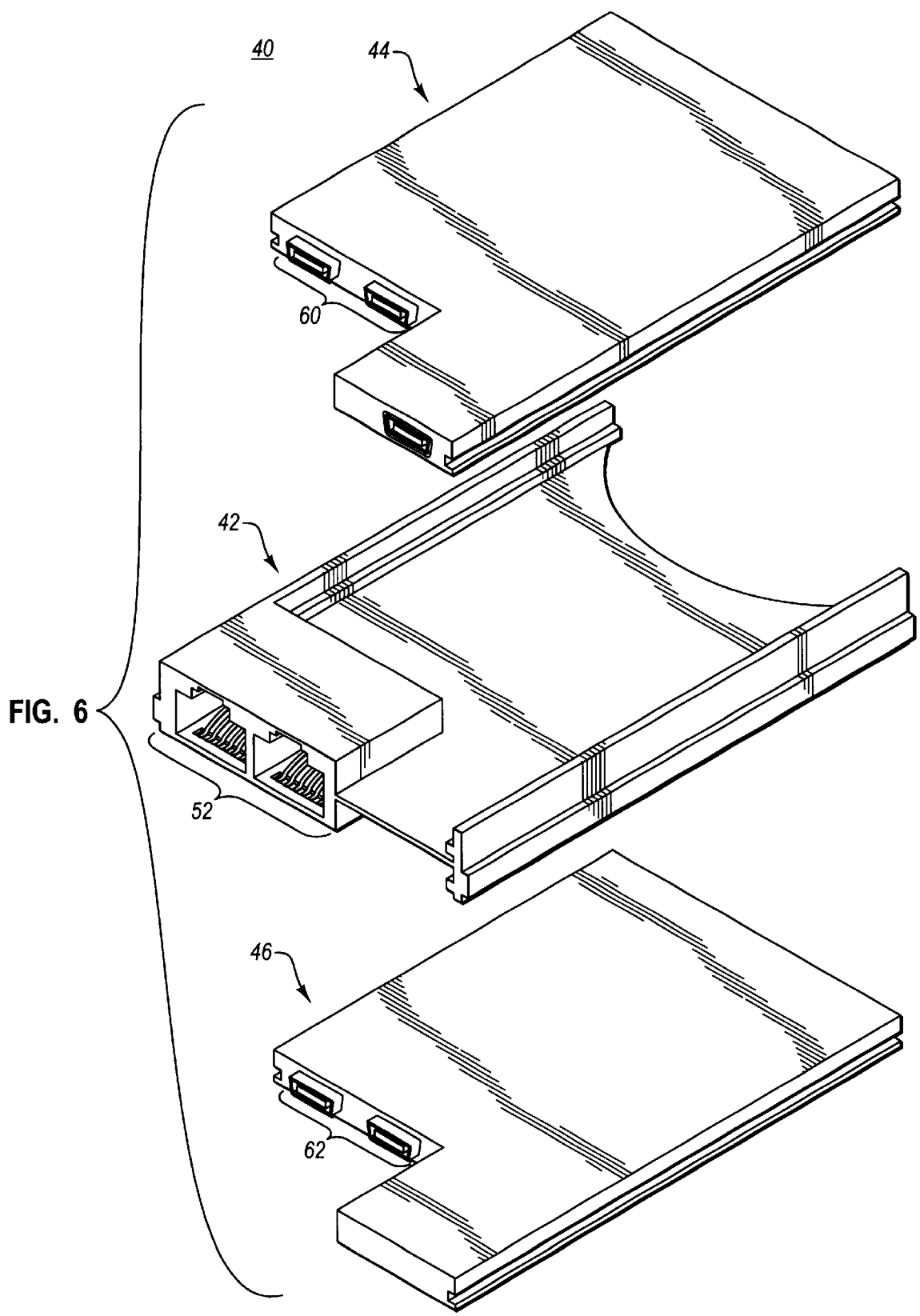
FIG. 6 is an exploded perspective view of a multi-slot card assembly, in accordance with a preferred embodiment of the present invention.

FIG. 6 is an exploded perspective view of the multi-slot card assembly 40, in accordance with a preferred embodiment of the present invention. The multi-slot card assembly 40 generally includes a multi-card interface tray 42 and one or more cards 44 and 46. In the preferred embodiment, the multi-card interface tray 42 further includes a shared interface 52 comprised of passive circuitry for coupling with the active circuitry on one or more cards 44 and 46. It should be noted as pointed out in more detail in FIG. 10, that the multi-slot card assembly 40 may be operative through the use of insertion of a single card 44, 46 interfacing with the shared interface 52 upon insertion within a host computer slot. It should also be pointed out when a plurality of cards 44, 46 are inserted into the multi-card interface tray 42 and coupled in parallel through the shared interface 52, sensing circuitry, known by those of skill in the art, on cards 44 and 46 may resolve any interfacing conflicts by sensing the line conditions of the media plug within the shared interface 52.

Figure 7:
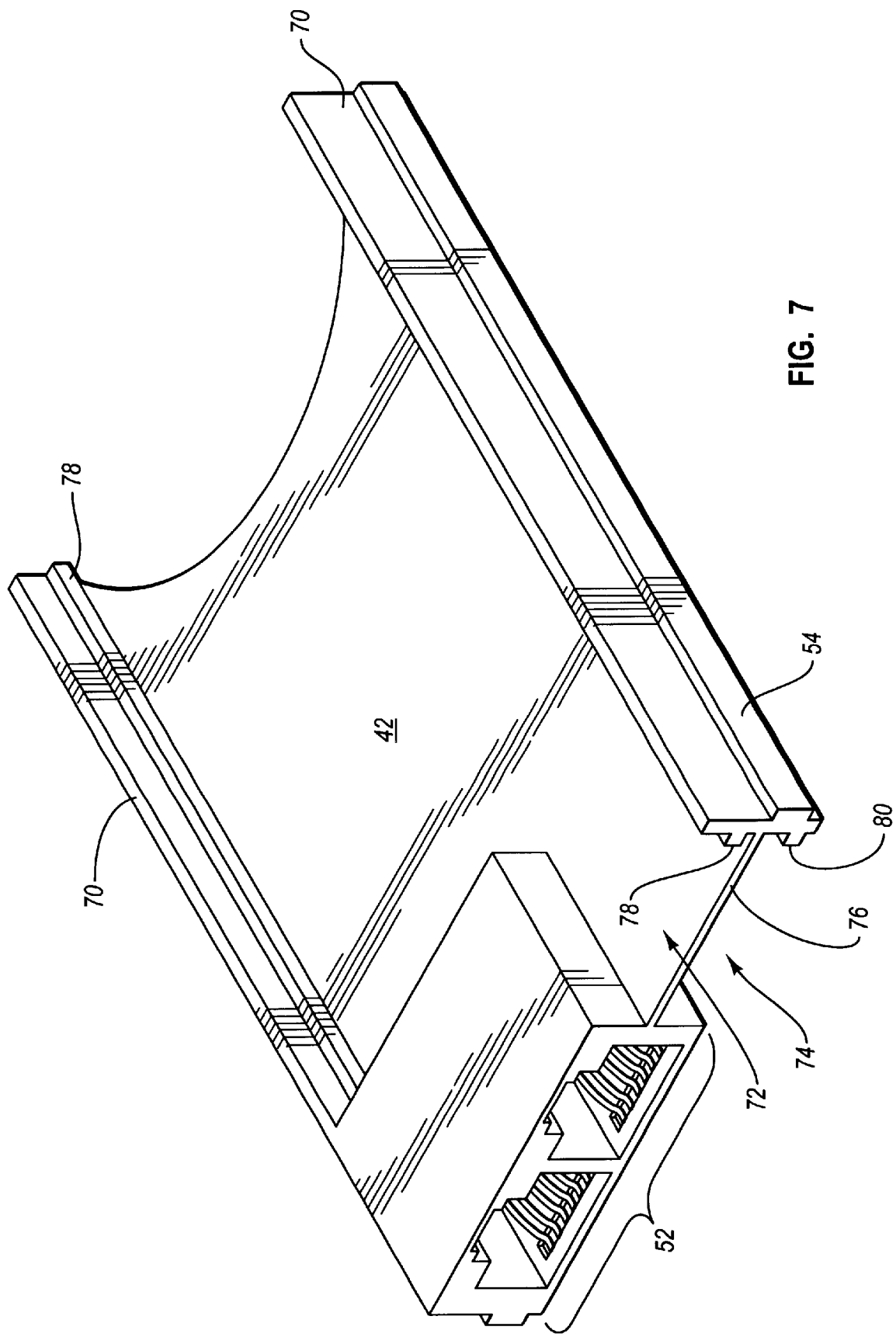
FIG. 7 is a perspective view of a multi-card interface tray of the multi-slot card assembly of the present invention.

FIG. 7 is a perspective view of the multi-card interface tray 42, in accordance with a preferred embodiment of the present invention. Structurally, the multi-card interface tray 42 generally includes opposing sidewalls 70 having an interior dimension conducive for the reception of first and second cards 44 and 46 (FIG. 6) and exterior dimensions in conformance with the specified standard to which the multi-slot card assembly 40 conforms, which in the present depiction conforms to the PCMCIA Type III form factor specification.

In order to maintain the fixed relationship of opposing sidewalls 70, the multi-card interface tray 42 further includes a sidewall separator 76 which in addition to fixing the relative orientation of opposing sidewalls 70, further partitions the interior region between sidewalls 70 into a first card bay 72, depicted as the upper card bay, and a second card bay 74 depicted as the lower card bay. It should be apparent that shared interface 52 intrudes into both first card bay 72 and second card bay 74 thereby facilitating both the desirable enlarged interface or sockets of shared interface 52 and facilitates the electrical interconnection of first card 44 and second card 46 (FIG. 6) with the shared interface 52.

In order to facilitate the retention of first and second cards 44 and 46 into corresponding first card bay 72 and second card bay 74, each of the opposing side rails in each of the individual card bays includes card guide rails for retaining the proper orientation of the cards within the card bays. By way of example, and not limitation, FIG. 7 depicts the card guide rails as first card guide rails 78 located within first card bay 72 and integral with opposing sidewalls 70, and corresponding second card guide rails 80 located within the second card bay 74 also integral with opposing sidewalls 70. While the present figure depicts square guide rails and corresponding square grooves on first and second cards 44 and 46, it is also contemplated within the present invention that rounded guide rails or even triangular for facilitating a snap-fit into the card bays find equal utility and acceptance within the scope of the present invention. Additionally, in a non-removable card application, cards 44 and 46 could be inserted within card bays 72 and 74 through the use of other retaining means such as through the use of adhesives or welding to sidewalls 70.

Also depicted within FIG. 7 is the standard interface guide rail 54 located on the exterior sides of opposing sidewall 70 for conformance with a particular host interface standard, which in the present depiction is a PCMCIA type three interface. Those of skill in the art further appreciate that while a single standard interface guide rail 54 is depicted which is in conformance with a traditional Type III card, multi standard interface guide rails on each of the exterior sides of opposing sidewall 70 would further comply with PCMCIA hosting slots that accommodate a plurality of stacked Type II cards within the host slot. Such variations are contemplated within the scope of the present invention.

Figure 8:
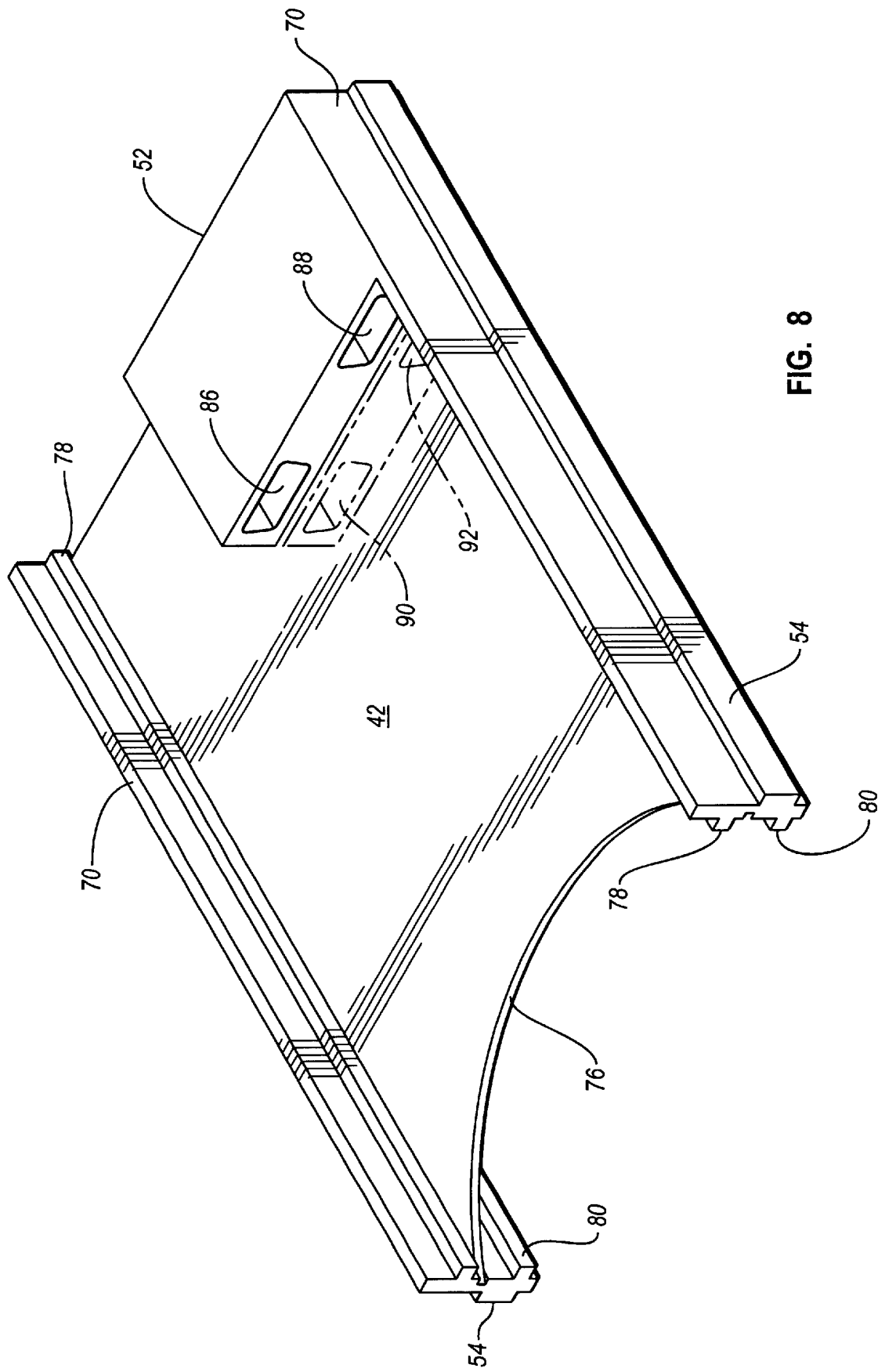
FIG. 8 is an opposing perspective view of the multi-card interface tray of the multi-slot card assembly of the present invention.

FIG. 8 is a rear view of the multi-card interface tray 42, in accordance with a preferred embodiment of the present invention. FIG. 8 depicts the interconnection interface between first and second cards 44 and 46 (FIG. 6) and the shared interface 52. While each of the figures have depicted a plurality of sockets or jacks located within shared interface 52, those of skill in the art appreciate that any number of jacks including a single jack could be present within shared interface 52. For illustrative purposes, FIG. 8 depicts a plurality of interconnects from each card 44 and 46 with the shared interface 52. For example, a first shared interface interconnect 86 and 88 are depicted separately for illustrative purposes only and it is contemplated that a single interconnect could support a single or multiple sockets or jacks within shared interface 52. Likewise, a second shared interface interconnect 90 and 92 are depicted as having a plurality of separate interconnects when in fact a single interconnect could also suffice for coupling with single or plural sockets or jacks of shared interface 52. While FIG. 8 depicts a sliding male/female coupling between the cards and shared interface 52, it is also contemplated that other contact arrangements both removable and non-removable function equally as well and are also included within the scope of the present invention.

Figure 9:
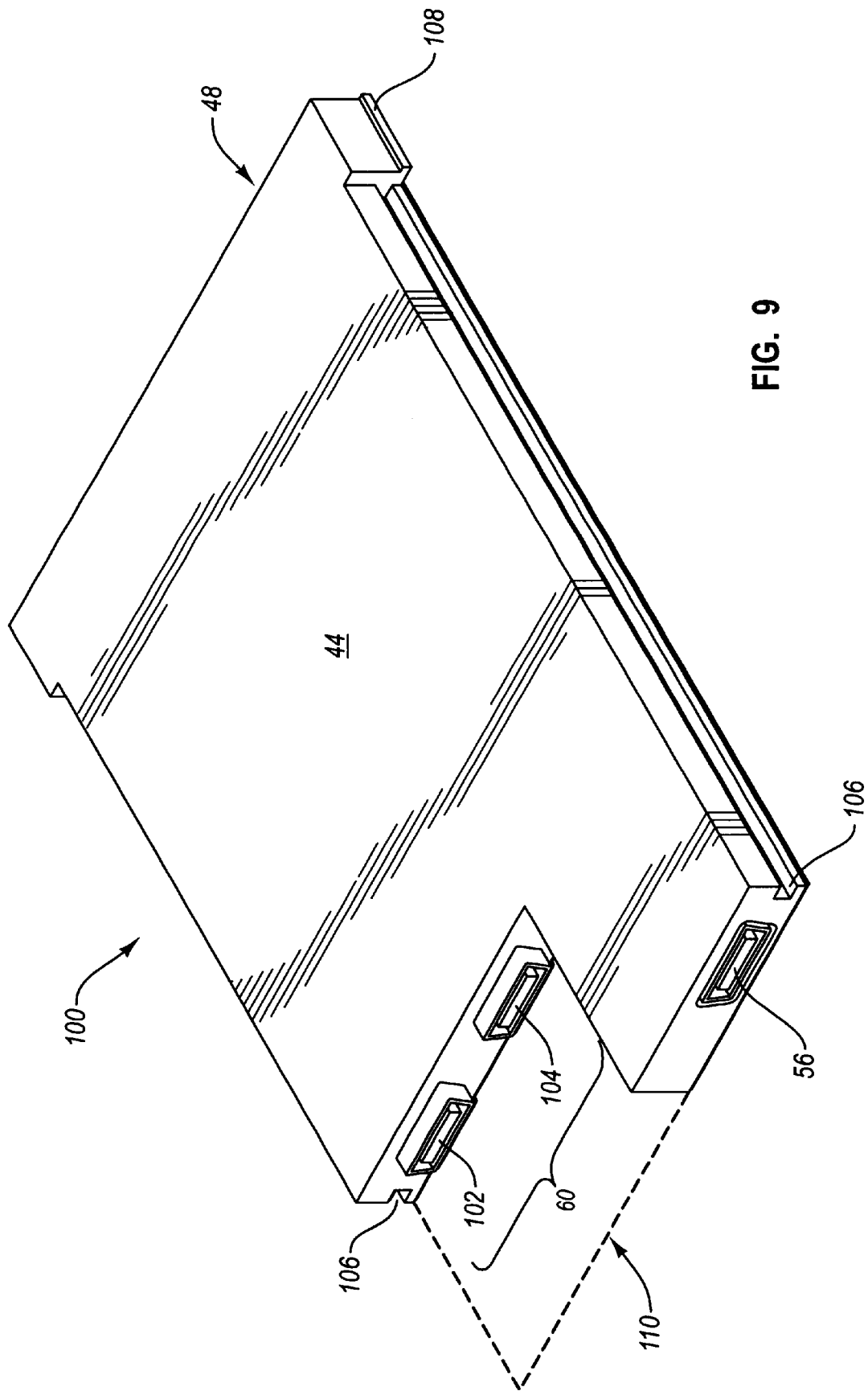
FIG. 9 is a perspective view of a card of the multi-slot card assembly of the present invention.

FIG. 9 is a perspective view of a card depicted herein as card 44. Those of skill in the art appreciate that cards such as communication and interface cards include active circuitry such as electronic components including processors, signal processors, drivers, bus interfaces, and the like, which provide adaptive functionality between the capabilities of the host computer and the external network. Furthermore, as mentioned above, card 44 may also assume functionality for servicing only one of the interfaces such as in the case of functioning as extended memory for the host system.

FIG. 9 depicts card 44 as comprising a housing 100 having a generally planer profile for reception within a card base 72, 74 (FIG. 7). The physical interface of card 44 with the multi-card interface tray 42 (FIG. 7), in the preferred embodiment, through card guide grooves 106 located on opposing sides of the housing 100. Card guide grooves 106 conform with an opposing interface illustrated in FIG. 7 as card guide rails 78, 80. The additional embodiments for physically coupling housing 100 with multi-card interface tray 42 are further repeated herein and include such groove/guide rail configurations which include rounded grooves, triangular grooves, friction-fit arrangements with nominal or no grooves as well as other more permanent fixations including adhesives and welding techniques.

Card 44 further includes a card host interface 48 for coupling both physically and electrically with the host system such as a personal computer. In the present depicted embodiment, card host interface 48 assumes a 68-pin PCMCIA form factor, while other form factors are contemplated within the scope of the present invention. Card 44 is further illustrated having host connector rails 108 for facilitating the precise alignment of the card host interface 48 with the receiving host connector. It should be pointed out the card guide grooves 106, when received within the corresponding card bay 72, 74 (FIG. 7), provide alignment of the card host interface 48 with the host system.

As discussed earlier, a shared interface 52 of the multi-slot card assembly 40 (FIG. 6) intrudes into both first card bay 72 and second card bay 74 (FIG. 7). As such, housing 100 of card 44 accommodates shared interface 52 through the excision of a card shared interface cutout 110 compatible in size with the portion of shared interface 52 intruding within the corresponding card bay into which card 44 is received. Card 44 further includes a card shared interface interconnect 60 for physically and electrically coupling card 44 with shared interface 52. FIG. 9 depicts card shared interface interconnect 60 as being comprised of separate interconnects 102 and 104 while, as discussed above in FIG. 8, a single interconnect suffices for coupling the circuitry of card 44 with the shared interface 52. As further described earlier, cards 44 and 46 may exhibit dedicated interfaces such as dedicated interface 56 which provide a discreet connection point directly into the electronics of card 44.

Figure 10:
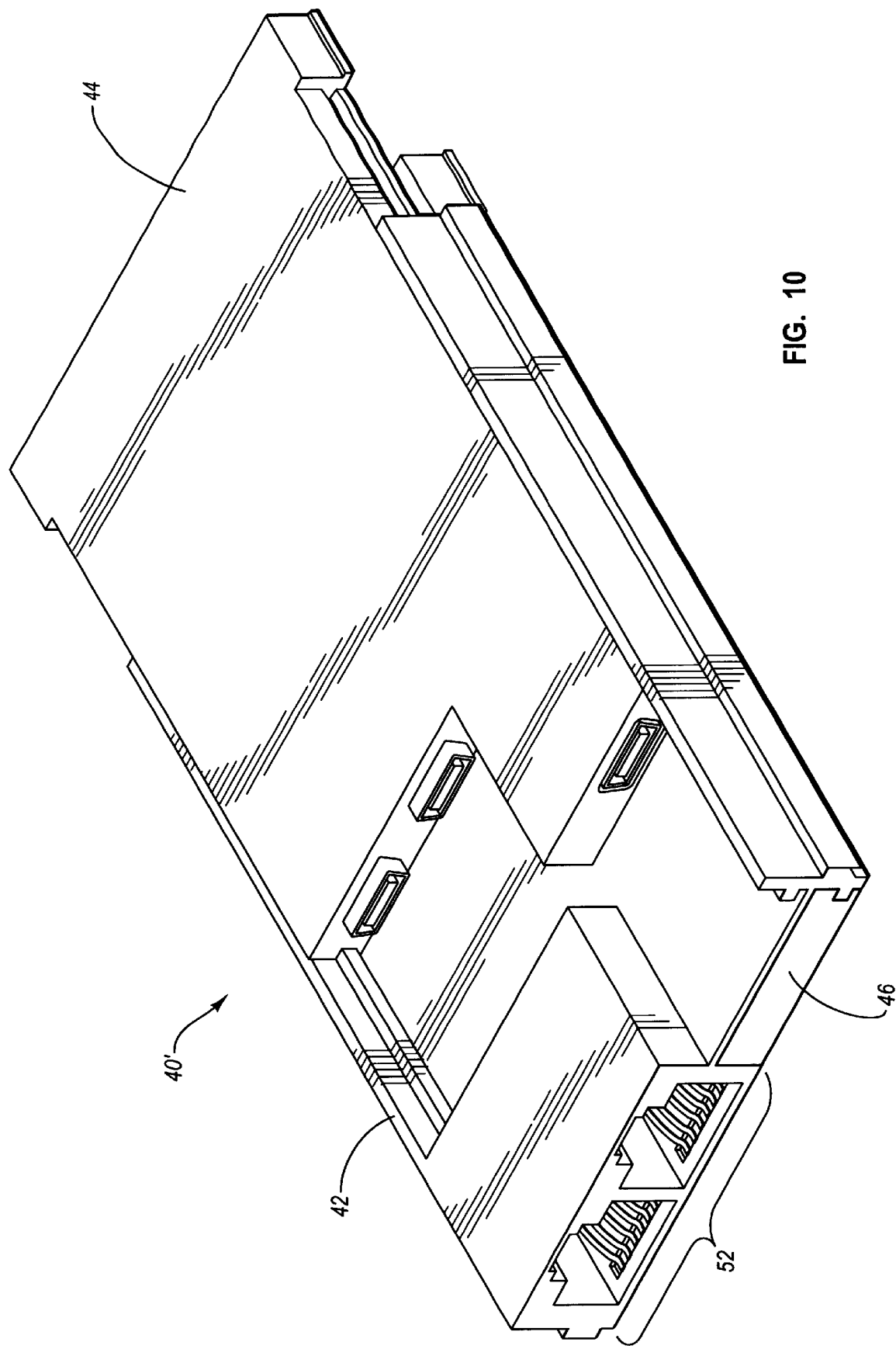
FIG. 10 is a perspective view of an alternate embodiment employing a single card only within the multi-card interface tray of the multi-slot card assembly, in accordance with another preferred embodiment of the present invention.

FIG. 10 is a perspective view of an alternate embodiment of multi-slot card assembly 40' in accordance with another preferred embodiment of the present invention. Multi-slot card assembly 40' depicts a partial population of multi-card interface tray 42 with a single card 46 resulting from the removal of card 44 or the partial population of the multi-card interface tray 42. It should be appreciated that shared interface 52, while being capable of being shared between a plurality of cards, is also functional in the presence of a single card.

It should be further appreciated that the present invention while finding application to flexibly combining desired functionality through the use of individual cards also finds utility by enabling the various functional cards to be upgraded as technology improves and advances, such as in the case of the speed with which networks and host computers may communicate. Additionally, the multi-slot card assembly of the present invention facilitates the combination of different circuit cards to utilize the same or shared user interface. It should be further pointed out that the present embodiment as depicted, facilitates the reversal or exchange of cards 44 and 46 between the corresponding card bays 72 and 74 (FIG. 7) due to the symmetry of the cards.

The present invention may be embodied in other specific forms without departing from its spirit or its essential characteristics. The described embodiments are to be considered in all respects only as illustrative and not restrictive. The scope of the invention is, therefore, indicated by the appended claims rather than by the foregoing description. All changes which come within the meaning and range and equivalence of the claims are to be embraced within their scope.

What is claimed and desired to be secured by United States Letters Patent is:

1. A computer card assembly capable of removeable insertion with a host computer having a receiving slot therein, said computer card assembly comprising:

(a) at least two electronic card sized smaller in at least one dimension than said receiving slot of said host computer, said electronic cards further each including a shared interface interconnect, and a host interface for physically and electrically coupling with said host computer in said receiving slot; and (b) an electronic card interface tray including:
  (i) an external shared interface, the external shared interface providing a detachable electrical connection between said shared interface interconnect of said electronic cards with electronics external to said host computer; and
  (ii) opposing sidewalls which together form at least two internal electronic card bays for receiving said at least two electronic cards therein, said electronic interface tray with said at least two electronic cards therein having external boundaries physically compatible for insertion within said receiving slot of said host computer.

2. The computer card assembly, as recited in claim 1, wherein said opposing sidewalls form two internal electronic card bays for receiving a first electronic card and a second electronic card in a stacked arrangement.

3. The computer card assembly, as recited in claim 2, wherein said first electronic card and said second electronic card include a first shared interface interconnect and a second shared interface interconnect, respectively, for internally physically and electrically coupling with a first shared interface interconnect and a second shared interface interconnect of said external shared interface.

4. The computer card assembly, as recited in claim 1, wherein said electronic card interface tray further comprises a sidewall separator spanning between said opposing sidewalls thereby forming a first internal electronic card bay above said sidewall separator and a second internal electronic card bay below said sidewall separator.

5. The computer card assembly, as recited in claim 4, wherein:
  a) said opposing sidewalls further include first opposing card guide rails within said first internal electronic card bay and second opposing card guide rails within said second internal electronic card bay; and
  b) said first and second electronic cards further include opposing guide grooves corresponding with said first and second opposing guide rails, said opposing guide rails for receiving and retaining said first and second electronic cards within said first and second internal electronic card bays, respectively.

6. The computer card assembly, as recited in claim 2, wherein said first and second electronic cards are symmetric and interchangeable between said two internal electronic card bays.

7. The computer card assembly, as recited in claim 1, wherein said electronic card interface tray further includes standard interface guide rails on external faces of said opposing sidewalls for interfacing with corresponding grooves within said receiving slot of said host computer.

8. The computer card assembly, as recited in claim 1, wherein said electronic interface tray and said at least one electronic card therein and conform to a PCMCIA interface standard.

9. The computer card assembly, as recited in claim 8, wherein said PCMCIA interface standard is of Type III.

10. The computer card assembly, as recited in claim 1, wherein said external shared interface extends only partially between said opposing sidewalls forming a shared interface cutout and said at least one electronic card extends into said shared interface cutout.

11. The computer card assembly, as recited in claim 10, wherein said at least one electronic card extending into said share interface cutout further includes a dedicated interface unique to said at least one electronic card.

12. The computer card assembly, as recited in claim 1, wherein said external shared interface further includes at least one jack external to said host computer complying with an RJ-11 specification.

13. The computer card assembly, as recited in claim 1, wherein said external shared interface further includes at least one jack external to said host computer complying with an RJ-45 specification.

14. A PCMCIA Type III computer card assembly comprising:
  (a) at least two electronic cards sized smaller in at least one dimension than said PCMCIA Type III specification, said at least two electronic cards further each including a shared interface interconnect, and a host interface physically and electrically compatible with a host interface of said PCMCIA Type III specification; and
  (b) an electronic card interface tray including:
    (i) an external shared interface, the external shared interface providing a detachable electrical connection between said shared interface interconnect of said electronic cards with electronics external to said PCMCIA Type III computer card; and
    (ii) opposing sidewalls which together form at least two internal electronic card bays for receiving said electronic cards therein, said electronic interface tray having external boundaries physically compatible with said PCMCIA Type III specification.

15. The PCMCIA Type III computer card assembly, as recited in claim 14, wherein said opposing sidewalls form two internal electronic card bays for receiving a first electronic card and a second electronic card in a stacked arrangement.

16. The PCMCIA Type III computer card assembly, as recited in claim 15, wherein said first electronic card and said second electronic card include a first shared interface interconnect and a second shared interface interconnect, respectively, for internally physically and electrically coupling with a first shared interface interconnect and a s second shared interface interconnect of said external shared interface.

17. The PCMCIA Type III computer card assembly, as recited in claim 14, wherein said electronic card interface tray further comprises a sidewall separator spanning between said opposing sidewalls thereby forming a first internal electronic card bay above said sidewall separator and a second internal electronic card bay below said sidewall separator.

18. The PCMCIA Type III computer card assembly, as recited in claim 17, wherein:
  a) said opposing sidewalls further include first opposing card guide rails within said first internal electronic card bay and second opposing card guide rails within said second internal electronic card bay; and
  b) said first and second electronic cards further include opposing guide grooves corresponding with said first and second opposing guide rails, said opposing guide rails for receiving and retaining said first and second electronic cards within said first and second internal electronic card bays, respectively.

19. The computer card assembly, as recited in claim 14, wherein said electronic card interface tray further includes standard interface guide rails on external faces of said opposing sidewalls for compliance with said PCMCIA Type III specification.

20. The PCMCIA Type III computer card assembly, as recited in claim 14, wherein said external shared interface further includes at least one jack complying with an RJ-xx specification.

21. A communication card assembly for communication between a host computer and an external network, said communication card assembly comprising:
(a) at least two electronic cards, each including a shared interface interconnect, and a host interface for physically and electrically coupling with said host computer; and
(b) an electronic card interface tray including:
  (i) an external shared interface, the external shared interface providing a detachable electrical connection between said shared interface interconnect of said electronic cards with electronics external to said host computer; and
  (ii) opposing sidewalls which together form at least two internal electronic card bays for receiving said electronic cards therein, said electronic interface tray with said at least one electronic cards therein having external boundaries physically compatible for insertion within a receiving slot of said host computer.

22. The communication card assembly, as recited in claim 21, wherein said opposing sidewalls form two internal electronic card bays for receiving a first electronic card and a second electronic card in a stacked arrangement.

23. The communication card assembly, as recited in claim 22, wherein said first electronic card and said second electronic card include a first shared interface interconnect and a second shared interface interconnect, respectively, for internally physically and electrically coupling with a first shared interface interconnect and a second shared interface interconnect of said external shared interface.

24. The communication card assembly, as recited in claim 21, wherein said electronic card interface tray further comprises a sidewall separator spanning between said opposing sidewalls thereby forming a first internal electronic card bay above said sidewall separator and a second internal electronic card bay below said sidewall separator.

25. The communication card assembly, as recited in claim 24, wherein:
a) said opposing sidewalls further include first opposing card guide rails within said first internal electronic card bay and second opposing card guide rails within said second internal electronic card bay; and
b) said first and second electronic cards further include opposing guide grooves corresponding with said first and second opposing guide rails, said opposing guide rails for receiving and retaining said first and second electronic cards within said first and second internal electronic card bays, respectively.

26. The communication card assembly, as recited in claim 21, wherein said electronic card interface tray further includes standard interface guide rails on external faces of said opposing sidewalls for interfacing with corresponding grooves within said receiving slot of said host computer.

27. The communication card assembly, as recited in claim 21, wherein said electronic interface tray and said at least one electronic card therein and conform to a PCMCIA interface standard.

* * * * *